United States Patent
Suzuki et al.

(10) Patent No.: US 7,209,723 B2
(45) Date of Patent: Apr. 24, 2007

(54) DIRECT CONVERSION CIRCUIT HAVING REDUCED BIT ERRORS

(75) Inventors: Takeo Suzuki, Fukushima-ken (JP); Shigeru Osada, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 438 days.

(21) Appl. No.: 10/801,370

(22) Filed: Mar. 16, 2004

(65) Prior Publication Data
US 2004/0185812 A1   Sep. 23, 2004

(30) Foreign Application Priority Data
Mar. 20, 2003   (JP)   ............... 2003-076939

(51) Int. Cl.
*H04B 1/06*   (2006.01)
(52) U.S. Cl. .................... 455/234.2; 455/324
(58) Field of Classification Search ............ 455/232.1, 455/234.1, 234.2, 253.2, 324; 375/345
See application file for complete search history.

(56) References Cited

U.S. PATENT DOCUMENTS

| | | | | |
|---|---|---|---|---|
| 4,866,395 A | * | 9/1989 | Hostetter | .................... 329/309 |
| 5,878,089 A | * | 3/1999 | Dapper et al. | .............. 375/325 |
| 6,314,278 B1 | * | 11/2001 | Zamat | ..................... 455/239.1 |
| 6,714,776 B1 | * | 3/2004 | Birleson | ..................... 455/302 |
| 2003/0003891 A1 | * | 1/2003 | Kivekas et al. | ............ 455/313 |
| 2004/0162104 A1 | * | 8/2004 | Ozluturk et al. | ......... 455/550.1 |

FOREIGN PATENT DOCUMENTS

| | | |
|---|---|---|
| JP | 9-168037 | 6/1997 |
| JP | 2003-273947 | 9/2003 |

* cited by examiner

*Primary Examiner*—Nguyen T. Vo
(74) *Attorney, Agent, or Firm*—Brinks Hofer Gilson & Lione

(57) ABSTRACT

A direct conversion circuit includes first and second mixers to which a radio frequency signal is input. An oscillator supplies the first and second mixers with local oscillation signals whose phases are orthogonal to each other. A baseband processing circuit processes baseband signals output from the first and second mixers. A level-difference correcting circuit which corrects the two baseband signals input to the baseband processing circuit so that the levels of both are equal to each other is provided in a stage before the first and second mixers. The levels of the baseband signals are corrected by changing relative levels of the radio frequency signal input to the first mixer and the radio frequency signal input to the second mixer.

8 Claims, 3 Drawing Sheets

DIRECT CONVERSION CIRCUIT HAVING REDUCED BIT ERRORS

This application claims the benefit of priority to Japanese Patent Application No.: 2003-076939, filed on Mar. 20, 2003, which is incorporated herein by reference.

BACKGROUND OF THE INVENTION

1. Field of the Invention

The present invention relates to a direct conversion circuit for directly outputting a baseband signal from a mixer circuit.

2. Description of the Related Art

A conventional direct conversion circuit is described with reference to FIG. 3. A reception signal 131 received by an antenna 101 is input to mixers 103 and 104. Also, cosine waves 133 and sine waves 134 are output from a phase shifter 102, to which a local oscillation signal 132 (Lo) is input, and are input to the mixers 103 and 104, respectively. The mixer 103 outputs a signal 135 by mixing the reception signal 131 and the cosine waves 133 and performing down-conversion, while the mixer 104 outputs a signal 136 by mixing the reception signal 131 and the sine waves 134 and performing downconversion.

Next, after direct-current offsets are eliminated by AC couplings 105 and 106, the signals 135 and 136 are output as signals 137 and 138, and after unnecessary frequency components are eliminated, the signals 137 and 138 are output as signals 139 and 140. The signals 139 and 140 are amplified to predetermined levels by amplifiers 109 and 110, and their output signals 141 and 142 are shaped in waveform by analog root Nyquist filters 111 and 112, whereby a baseband I signal 143 and a baseband Q signal 144 having a shaped spectrum are obtained. The baseband I signal 143 and the baseband Q signal 144 are converted into digital signals by A/D converters 113 and 114, whereby signals 145 and 146 are obtained (see, for example, Japanese Unexamined Patent Application Publication No. 09-168037 (FIG. 3)).

In the above-described conventional configuration, even if there is no level difference between the reception signals input to one mixer 103 and the other mixer 104, when there is a difference, for example, in conversion gain between mixer 103 and mixer 104, and similarly, when there is a difference in gain between amplifier 109 and amplifier 110, a level difference occurs between the baseband I signal input to the A/D converter 113 and the baseband Q signal input to the A/D converter 114. In this state, conversion of each baseband signal into a digital signal by each A/D converter causes bit errors.

SUMMARY OF THE INVENTION

Embodiments of the present invention reduce bit errors by equalizing the levels of a plurality of baseband signals which are input to a baseband processing circuit.

According to an aspect of the present invention, a direct conversion circuit is provided which includes first and second mixers to which a radio frequency signal is input, an oscillator for supplying the first and second mixers with local oscillation signals whose phases are orthogonal to each other, a baseband processing circuit for processing baseband signals output from the first and second mixers, and a level-difference correcting circuit in a stage before the first and second mixers which, by changing relative levels of the radio frequency signal input to the first mixer and the radio frequency signal input to the second mixer, corrects the two baseband signals input to the baseband processing circuit so that the levels of both are equal to each other.

Preferably, a level correcting voltage corresponding to a difference in level between the two baseband signals input to the baseband processing circuit is output from the baseband processing circuit and is input to the level-difference correcting circuit.

The level-difference correcting circuit may include first and second transistors differentially connected to each other and having bases between which the radio frequency signal is input, third and fourth transistors having emitters connected to the collector of the first transistor, and fifth and sixth transistors having emitters connected to the collector of the second transistor. Load resistors may be respectively connected to the collectors of the third to sixth transistors. Radio frequency signals output from the collectors of the first and third transistors may be input to the first mixer, and radio frequency signals output from the collectors of the second and fourth transistor may be input to the second mixer. The level correcting voltage may be input between the bases of the third and sixth transistors and may be input between the bases of the fourth and fifth transistors.

As described above, according to the present invention, in a stage before first and second mixers, a level-difference correcting circuit which, by changing relative levels of the radio frequency signal input to the first mixer and the radio frequency signal input to the second mixer, corrects the two baseband signals input to the baseband processing circuit so that the levels of both are equal to each other is provided. Thus, bit errors can be eliminated.

Also, a level correcting voltage corresponding to a difference in level between the two baseband signals input to the baseband processing circuit is output from the baseband processing circuit, and the level correcting voltage is input to the level-difference correcting circuit. Thus, even if there is a level difference between the two baseband signals input to the baseband processing circuit, automatic correction so that both signals are in the same level is performed, whereby bit errors are eliminated.

Also, the level-difference correcting circuit includes first and second transistors differential-connected and having bases between which the radio frequency signal is input, third and fourth transistors having emitters connected to the collector of the first transistor, and fifth and sixth transistors having emitters connected to the collector of the second transistor, load resistors are respectively connected to the collectors of the third to sixth transistors. Radio frequency signals output from the collectors of the first and third transistors are input to the first mixer and radio frequency signals output from the collectors of the second and fourth transistor are input to the second mixer, and the level correcting voltage is input between the bases of the third and sixth transistors and between the bases of the fourth and fifth transistors. Thus, relative levels of the radio frequency signal input to the first mixer and the radio frequency signal input to the second mixer can be changed.

DESCRIPTION OF THE PREFERRED EMBODIMENT

Figure 1:
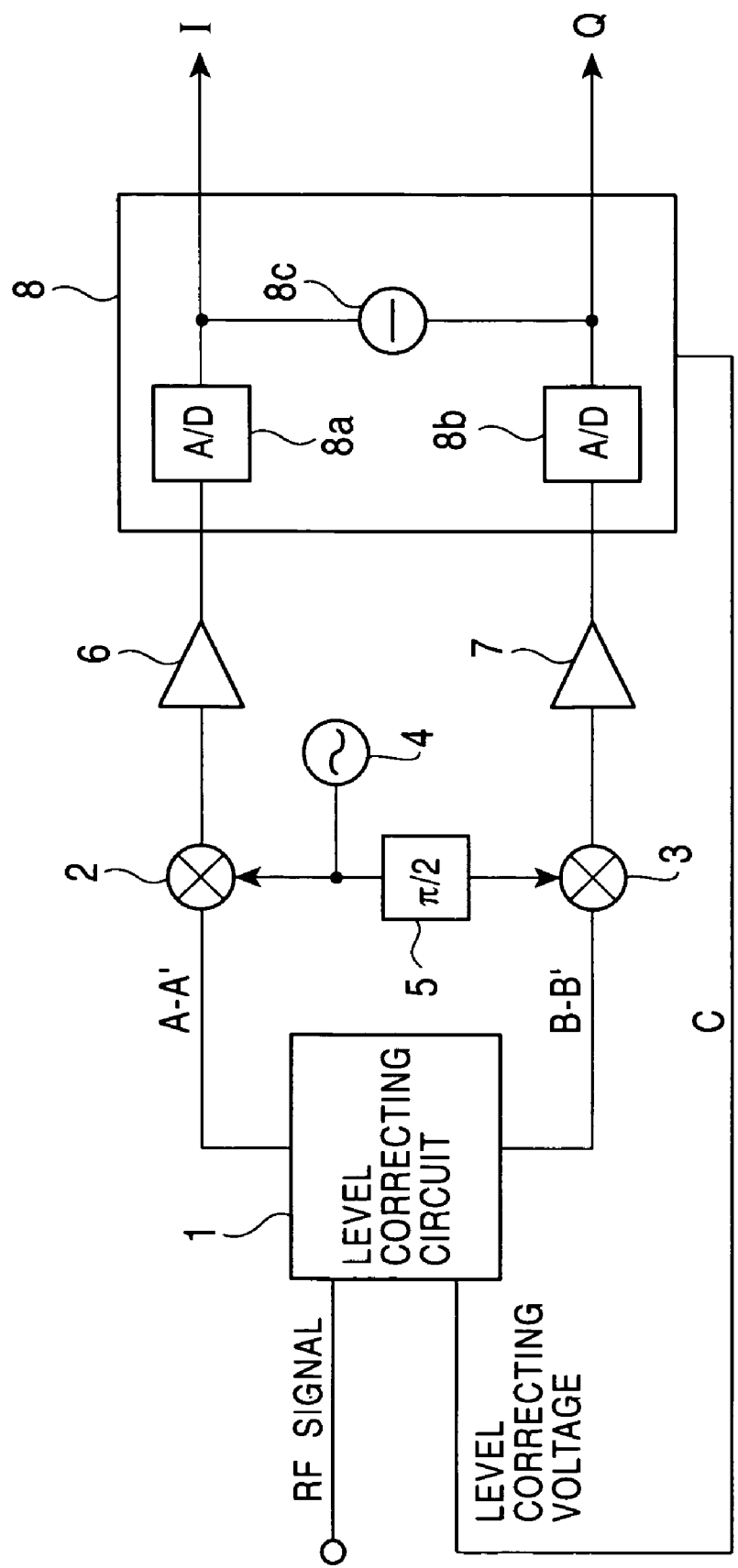
FIG. 1 is a circuit diagram showing a direct conversion circuit according to an aspect of the present invention.

A direct conversion circuit according to an embodiment of the present invention is described with reference to FIGS. 1 and 2. As shown in FIG. 1, a radio frequency signal (RF signal) received by an antenna (not shown) is input to a first mixer 2 and a second mixer 3 through a level correcting circuit 1. A local oscillation signal is input from an oscillator 4 to the first and second mixers 2 and 3, with the local oscillation signal input to the mixer 3 through a 90-degree phase shifter, so that the inputs to the two mixers have orthogonal phases. The frequency of the local oscillation signal is equal to that of the received radio frequency signal. Thus, baseband signals (I and Q signals) whose phases are orthogonal to each other are output from the first and second mixers 2 and 3. The first and second mixers 2 and 3 may be formed by a balanced circuit.

The baseband I signal output from the first mixer 2 is amplified by a baseband amplifier 6 and is input to a baseband processing circuit 8, and also the baseband Q signal output from the second mixer 3 is amplified by a baseband amplifier 7 and is input to the baseband processing circuit 8. Although filters, blocking capacitors, etc., may be provided in stages before and after each of the baseband amplifiers 6 and 7, their representation is omitted.

The baseband processing circuit 8 includes an A/D conversion unit 8a for converting the baseband I signal into a digital signal, an A/D conversion unit 8b for converting the baseband Q signal into a digital signal, and a subtracting unit 8c for calculating the difference between the two digital signals, whereby the digital signals are processed. When there is a level difference between the baseband I signal and the baseband Q signal which are respectively input to the A/D conversion units 8a and 8b, bit error occurs. In this case, the baseband processing circuit 8 outputs a level correcting voltage C corresponding to the level difference of the input baseband signals. The level correcting voltage C is fed back to the level correcting circuit 1.

The level correcting circuit 1 having the above configuration is configured so that the input level correcting voltage can relatively change the level of the radio frequency signal input to the mixer 2 and the level of the radio frequency signal input to the mixer 3. A circuit suitable for this function is shown in FIG. 2.

Figure 2:
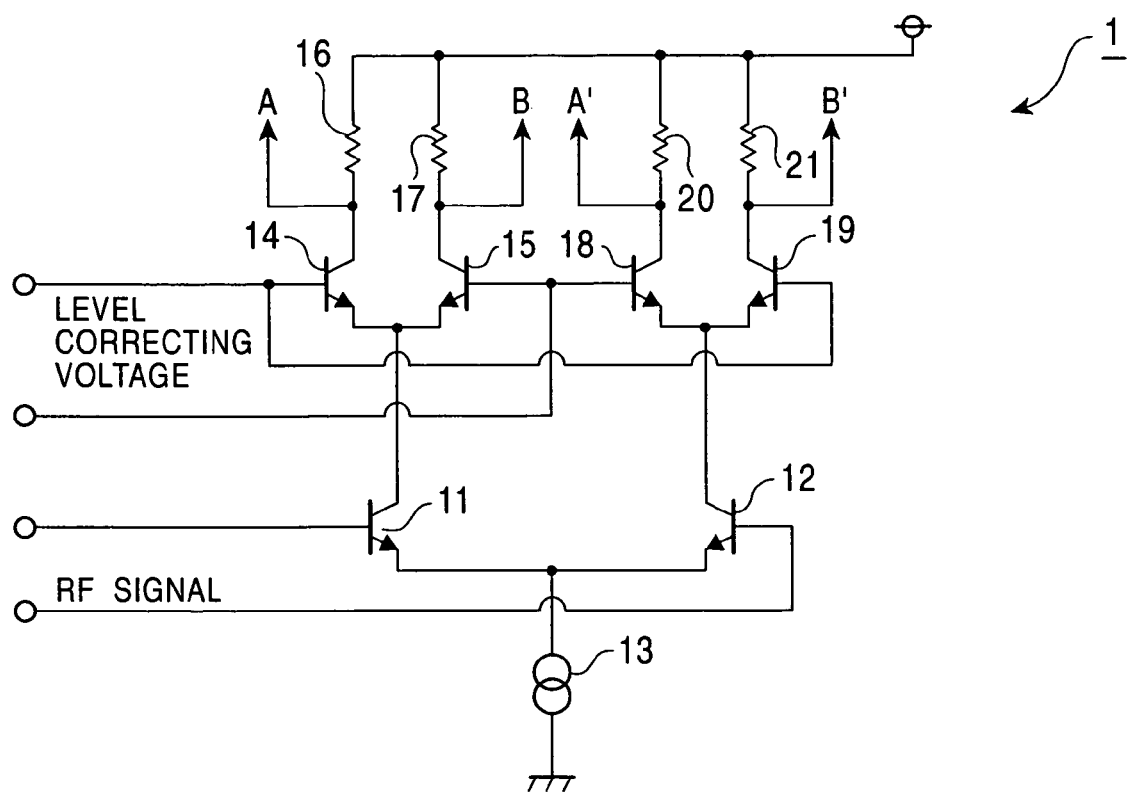
FIG. 2 is a specific circuit diagram of a level correcting circuit for use in a direct conversion circuit of an aspect of the present invention.
Figure 3:
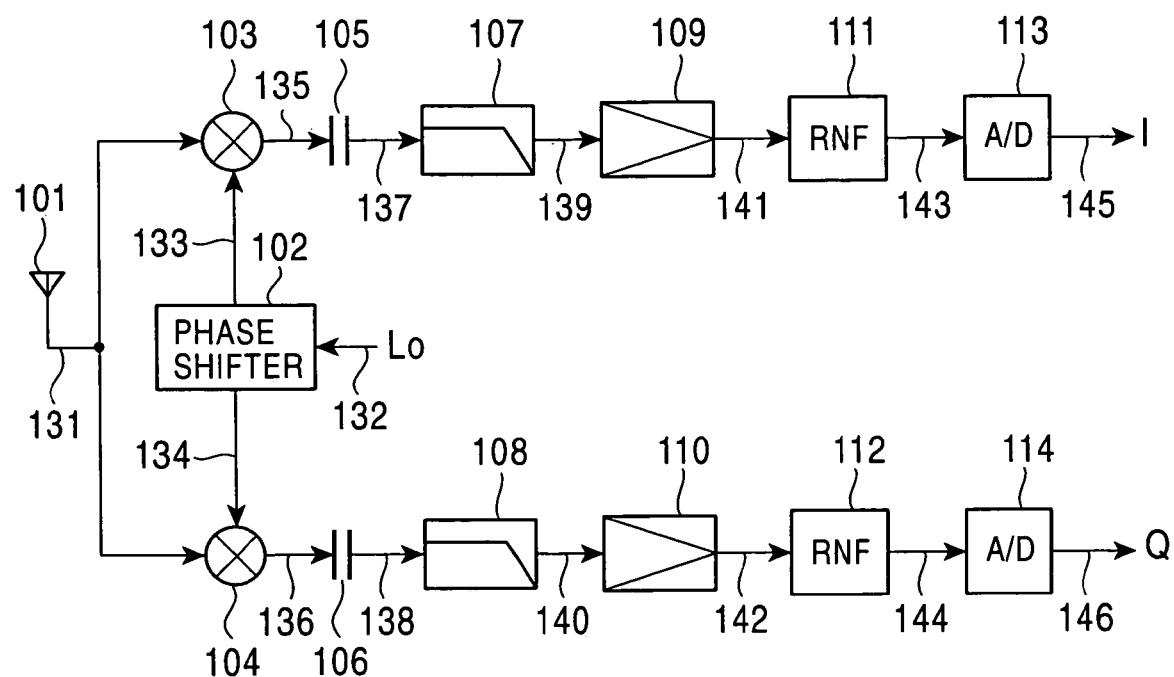
FIG. 3 is a circuit diagram showing the configuration of a conventional direct conversion circuit.

In FIG. 2, the radio frequency signal from the antenna is input between the bases of first and second transistors 11 and 12 which are differential-connected to each other. The emitter of the first transistor 11 and the emitter of the second transistor 12 are both connected to a constant current supply 13, whereby differential connection is established. The collector of the first transistor 11 connects to the emitters of third and fourth transistors 14 and 15, and their collectors are supplied with power by their load resistors 16 and 17. The collector of the second transistor 12 connects to the emitters of fifth and sixth transistors 18 and 19, and their collectors are supplied with power by their load resistors 20 and 21.

The base of the third transistor 14 and the base of the sixth transistor 19 are connected to each other, and the base of the fourth transistor 15 and the base of the fifth transistor 18 are connected to each other. The level correcting voltage C, which, in this example, is balanced, is input between the bases of the third and sixth transistors 14 and 19 and between the bases of the fourth and fifth transistors 15 and 18. A balanced signal generated between the collector (point A) of the third transistor 14 and the collector (point A') of the fifth transistor 18 is input to the first mixer 2 in a balanced manner, and a balanced signal generated between the collector (point B) of the fourth transistor 15 and the collector (point B') of the sixth transistor 19 is input to the second mixer 3 in a balanced manner.

Here, when the level correcting voltage C is zero, that is, the bases of the third and sixth transistors 14 and 19, and the bases of the fourth and fifth transistors 15 and 18 have equal potentials, a radio frequency signal generated between points A and A' and a radio frequency signal generated between points B and B' have equal levels. However, when the potentials of the bases of the third and sixth transistors 14 and 19 are higher than the potentials of the bases of the fourth and fifth transistors 15 and 18, the level of the radio frequency signal generated between points A and A' is greater than the level of the radio frequency signal generated between points B and B', while, conversely, when the potentials of the bases of the third and sixth transistors 14 and 19 are lower than those of the bases of the fourth and fifth transistors 15 and 18, the level of the radio frequency signal generated between points A and A' is less than that of the radio frequency signal generated between points B and B'. In other words, the level of the radio frequency signal input to the first mixer 2 and the level of the radio frequency signal input to the second mixer 3 are relatively changed by the level correcting voltage C.

As a result, the baseband I signal and baseband Q signal input to the baseband processing circuit 8 are controlled to be at the same level. Thus, bit errors are eliminated in the process of signal processing in the baseband processing circuit 8.

What is claimed is:

1. A direct conversion circuit comprising:
   first and second mixers to which radio frequency signals are input, said radio frequency signals being obtained from a single signal input;
   an oscillator for supplying the first and second mixers with local oscillation signals whose phases are orthogonal to each other;
   a baseband processing circuit for processing baseband signals output from the first and second mixers; and
   a level-difference correcting circuit in a stage before the first and second mixers, the level-difference correcting circuit adjusting the two baseband signals input to the baseband processing circuit so that levels of both baseband signals are equal to each other by changing relative levels of the radio frequency signal input to the first mixer and the radio frequency signal input to the second mixer.

2. A direct conversion circuit according to claim 1, wherein a level correcting voltage corresponding to a difference in level between the two baseband signals input to the baseband processing circuit is output from the baseband processing circuit and is input to the level-difference correcting circuit.

3. A direct conversion circuit according to claim 2, wherein:
   the level-difference correcting circuit includes: first and second transistors differential-connected to each other and having bases between which the radio frequency signal is input; third and fourth transistors having emitters connected to a collector of the first transistor, and fifth and sixth transistors having emitters connected to a collector of the second transistor;
   load resistors are respectively connected to collectors of the third to sixth transistors;
   radio frequency signals output from the collectors of the first and third transistors are input to the first mixer and radio frequency signals output from the collectors of the second and fourth transistors are input to the second mixer; and the level correcting voltage is input between the bases of the third and sixth transistors and is input between bases of the fourth and fifth transistors.

4. A direct conversion circuit according to claim 3, wherein the level correcting voltage is a balanced voltage.

5. A direct conversion circuit according to claim 1, wherein the level correcting voltage is a balanced voltage.

6. A direct conversion circuit according to claim 1, wherein the change in level of the radio frequency signal input to the first mixer and the radio frequency signal input to the second mixer is differential.

7. A method of equalizing the in-phase and quadrature signal levels of a direct-conversion receiver comprising:

deriving a plurality of radio frequency signals from a single input source;

amplifying each of the plurality of radio frequency signals in amplifiers whose gain is variable, the plurality of radio frequency signals being relatively varied;

applying the amplified signals to in-phase and quadrature mixers to perform downconversion;

low-pass filtering the downconversion output of the mixers;

digitizing the low-pass filtered in-phase and quadrature signals;

determining the difference in amplitude between the digitized in-phase and quadrature signals; and adjusting the gain of each of the variable gain amplifiers such that the in-phase and quadrature signals are of equal amplitude at the input to a digitizer.

8. A means for equalizing the in-phase and quadrature signal levels of a direct-conversion receiver comprising:

means for providing a plurality of signals from the same input source;

means for quadrature downconverting the plurality of signals;

means for low-pass filtering the plurality of downconverted signals;

means for digitizing the plurality of downconverted signals;

means for determining the difference in amplitude between the plurality of digitized signals;

means for relatively adjusting the amplitude of the plurality of signals at a point between the signal input source and the downconversion means such that the difference in amplitude between the plurality of signals at an input of the digitizing means is zero.

* * * * *